(12) United States Patent
Helbing

(10) Patent No.: US 7,988,311 B2
(45) Date of Patent: Aug. 2, 2011

(54) LIGHT EMITTING DEVICE HAVING A PHOSPHOR LAYER

(75) Inventor: Rene Helbing, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 12/164,506

(22) Filed: Jun. 30, 2008

(65) Prior Publication Data

US 2009/0323304 A1 Dec. 31, 2009

(51) Int. Cl.
*F21V 9/16* (2006.01)
(52) U.S. Cl. ............... 362/84; 362/800; 257/98; 438/16
(58) Field of Classification Search .................... 362/84, 362/235, 267, 249.01, 249.02; 313/485–487; 257/98, 100, 406, E21.521; 438/14–16; 118/712
See application file for complete search history.

(56) References Cited

U.S. PATENT DOCUMENTS

| | | | |
|---|---|---|---|
| 7,224,000 B2 * | 5/2007 | Aanegola et al. | 257/98 |
| 7,256,057 B2 * | 8/2007 | Schardt et al. | 438/14 |
| 7,495,380 B2 * | 2/2009 | Jun | 313/495 |
| 2003/0003614 A1 * | 1/2003 | Andriessen | 438/22 |
| 2005/0236984 A1 * | 10/2005 | Aoyama et al. | 313/509 |
| 2007/0246712 A1 | 10/2007 | Kim et al. | |
| 2008/0054280 A1 * | 3/2008 | Reginelli et al. | 257/98 |
| 2008/0315228 A1 * | 12/2008 | Krames et al. | 257/98 |

* cited by examiner

*Primary Examiner* — Thomas M Sember
(74) *Attorney, Agent, or Firm* — Arent Fox LLP

(57) ABSTRACT

A light emitting device and method of producing the same is disclosed. The light emitting device includes a light emitting semiconductor, an encapsulation layer, wherein the light emitting semiconductor is disposed within the encapsulation layer, a phosphor layer provided over the encapsulation layer, and an air gap provided between the encapsulation layer and the phosphor layer.

11 Claims, 5 Drawing Sheets

LIGHT EMITTING DEVICE HAVING A PHOSPHOR LAYER

BACKGROUND

1. Field

The present disclosure relates to light emitting devices, and more particularly, to semiconductor light emitting devices having a phosphor layer.

2. Background

Light emitting diodes (LEDs) are attractive candidates for replacing conventional light sources, such as incandescent lamps and fluorescent light sources. LEDs have substantially higher light conversion efficiencies than incandescent lamps and longer lifetimes than both types of conventional light sources. In addition, some types of LEDs now have higher conversion efficiencies than fluorescent light sources and still higher conversion efficiencies have been demonstrated in the laboratory. Furthermore, LEDs require lower voltages than fluorescent lamps, and therefore, are better suited for applications in which the light source must be powered from a low-voltage source, such as a battery or an internal computer DC power source.

Unfortunately, LEDs produce light in a relatively narrow spectrum band. To replace conventional lighting sources, LEDs that generate light that appears to be "white" to the human observer are required. A light source that appears to be white and that has a conversion efficiency comparable to that of fluorescent light sources can be constructed from a blue light emitting semiconductor covered with a phosphor layer that converts a portion of the blue light to yellow light. If the ratio of blue to yellow light is chosen correctly, the resultant light source appears white to a human observer.

The phosphor layer is typically a mixture of phosphor particles and silicone. During the manufacturing process of the LED, a cavity with the light emitting semiconductor is usually filled with the phosphor-silicone mixture such that the phosphor layer is created on top of the light emitting semiconductor. This phosphor layer, however, may contain variations in the phosphor particle distribution within the silicone, as well as variations in thickness. These physical variations, which are not typically controlled during the manufacturing process, result in LEDs with inconsistent characteristics, such as color temperature and color rendering index. As a result, the LEDs undergo a binning process wherein the LEDs are separated based on their various characteristics and assigned a specific bin code. Binning increases the manufacturing cost of the LEDs.

Accordingly, although contemporary LEDs have proven generally suitable for their intended purposes, the additional manufacturing cost associated with binning detracts from their overall desirability. As such, there exists a need for an LED that may be manufactured with consistent characteristics and without the added cost of binning.

SUMMARY

In one aspect of the disclosure, a light emitting device, includes a light emitting semiconductor, an encapsulation layer, wherein the light emitting semiconductor is disposed within the encapsulation layer, a phosphor layer provided over the encapsulation layer, and an air gap provided between the encapsulation layer and the phosphor layer.

In another aspect of the disclosure, a method for manufacturing a light emitting device includes determining the optical characteristics of a light emitting semiconductor, and determining the optical characteristics of a phosphor layer prior to incorporating the phosphor layer into the light emitting device.

It is understood that other aspects of light emitting devices will become readily apparent to those skilled in the art from the following detailed description, wherein it is shown and described only in examples of various aspects of light emitting devices by way of illustration. As will be realized, the various aspects of light emitting devices disclosed herein are capable of modification in various other respects, all without departing from the spirit and scope of the present disclosure. Accordingly, the drawings and detailed description that follow are to be regarded as illustrative in nature and not as restrictive.

BRIEF DESCRIPTION OF THE DRAWINGS

Various aspects of the present disclosure are illustrated by way of example, and not by way of limitation, in the accompanying drawings, wherein.

DETAILED DESCRIPTION

The detailed description set forth below in connection with the appended drawings is intended as a description of various aspects of light emitting devices and is not intended to represent all ways in aspects of the present invention may be practiced. The detailed description may include specific details for the purpose of providing a thorough understanding of various aspects of light emitting devices; however, it will be apparent to those skilled in the art that the present invention may be practiced without these specific details. In some instances, well-known structures and components are summarily described and/or shown in block diagram form in order to avoid obscuring the concepts of the present invention.

Furthermore, various descriptive terms used herein, such as "provided on" and "transparent," should be given the broadest meaning possible within the context of the present disclosure. For example, when a layer is said to be "provided on" another layer, it should be understood that that one layer may be deposited, etched, attached, or otherwise prepared or fabricated directly or indirectly above that other layer. Also, something that is described as being "transparent" should be understood as having a property allowing no significant obstruction or absorption of electromagnetic radiation in the particular wavelength (or wavelengths) of interest.

Figure 1:
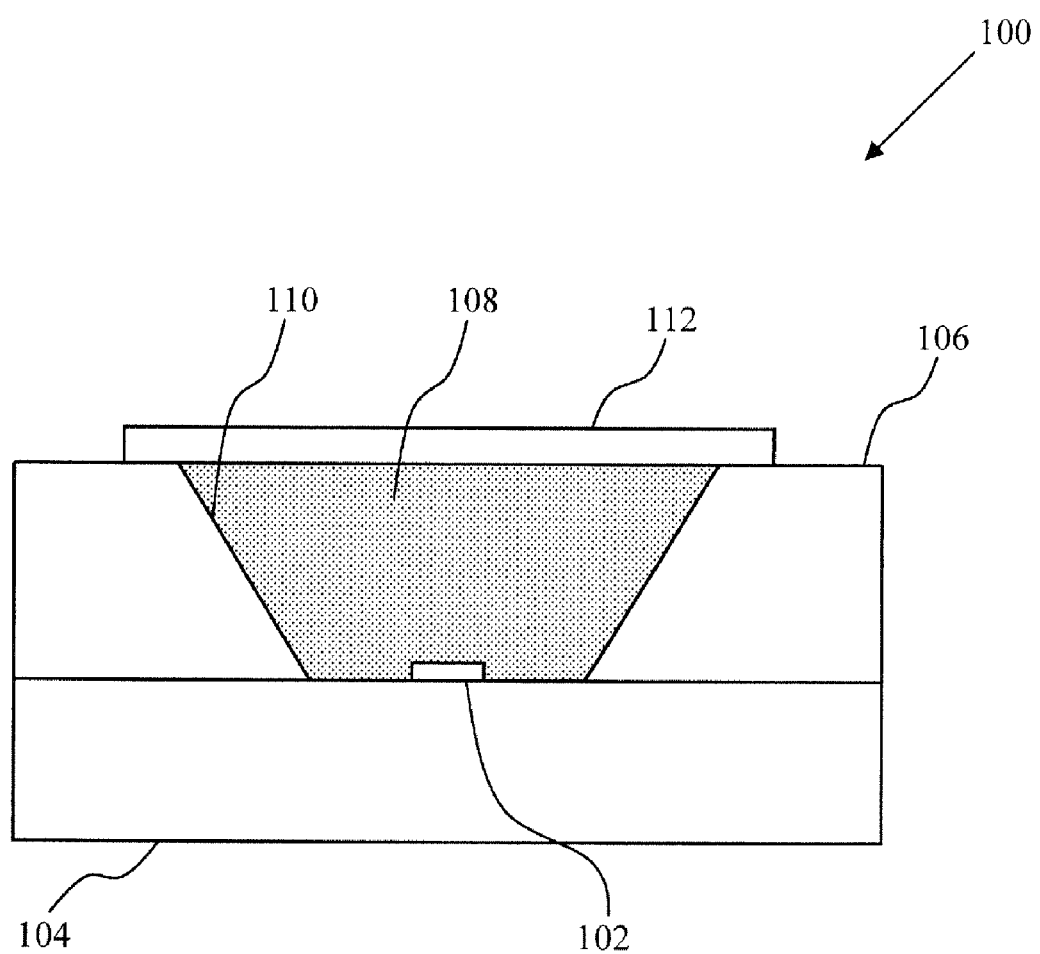
FIG. 1 is a cross-section view illustrating an example of a light emitting device having a phosphor layer.

FIG. 1 is a cross-section view illustrating an example of a light emitting device 100 having a phosphor layer 112. In this example, the device may include a blue light emitting semiconductor 102 provided on a substrate 104. The light emitting semiconductor 102 may be driven by a power source (not shown) that is electrically coupled to the light emitting semiconductor 102 via electrically conductive traces (not shown). The substrate 104 may be an insulating material, such as ceramic or epoxy laminate, for example. A recessed housing 106, which is provided on the substrate 104, may be formed by boring a cavity 108, such as a conical cavity, for example, in a layer of a material, such as ceramic, resin, polyphthalamide, polycarbonate, or some other suitable material; coating an inner wall 110 of the cavity 108 with a reflective material, such as, for example, aluminum, silver, or a suitable plastic impregnated via injection molding with titanium dioxide, for example; and then bonding the housing 106 onto the substrate 104. Alternatively, the recessed housing 106 may be formed by boring the cavity 108 directly in the substrate 104. The light emitting semiconductor 102 may be bonded to the substrate 104 after the recessed housing 106 is formed.

After the light emitting semiconductor 102 is bonded to the substrate 104, a transparent index-matching material, such as silicone, is deposited into the cavity 108. Thereafter, the phosphor layer 112 may be provided on the recessed housing 106 covering the cavity 108 and the light emitting semiconductor 102.

The phosphor layer 112 is used in combination with the light emitting semiconductor 102 to create light with a range of color temperatures and spectral composition. The phosphor layer 112 may include a mixture of silicone and phosphor particles, which are evenly dispersed and suspended within the silicone. The phosphor particles may be of different colors (e.g., yellow, red, blue) in order to enhance a color rendering index of the light produced by the device 100. The phosphor layer 112 may have a round disk-like shape in order to provide a uniform radiation pattern.

In order to control the phosphor particle distribution and thickness of the phosphor layer 112, the phosphor layer 112 may be manufactured separately by any suitable process, such as doctor blading or screen printing, for example. The manufacturing process of the phosphor layer 112 can be controlled to optimize the uniformity of phosphor particle distribution and the thickness of the phosphor layer 112. Once the phosphor layer 112 is manufactured, it can be tested separately from the light emitting semiconductor 102. This provides the opportunity to determine the respective optical characteristics (e.g., color temperature, color rendering index) of the phosphor layer 112 and the light emitting semiconductor 102. In this manner, the optical characteristics of a plurality of phosphor layers 112 and light emitting semiconductors 102 may be obtained prior to their incorporation into respective devices 100. Based on some predetermined criteria for the device 100, a phosphor layer 112 and a light emitting semiconductor 102 having specific characteristics may be required for use in the construction of the device 100. Selecting the phosphor layer 112 and the light emitting semiconductor 102 with the desired characteristics allows for the optical characteristics of the device 100 to be predetermined. Predetermining the optical characteristics of the device 100 in such a manner may eliminate the binning process, and thus, reduce manufacturing costs.

During operation, the light emitting semiconductor 102 may emit a blue light. A portion of the blue light may be absorbed by the phosphor particles of the phosphor layer 112 and the remaining blue light may pass through the phosphor layer 112. Once the blue light is absorbed by a phosphor particle, the phosphor particle may emit a light of its respective color. This secondary emission of colored light from the phosphor particle, also known as a Stokes shift, is optically mixed with the remaining blue light, and the mixed spectra thus produced is perceived by the human eye as being white.

Figure 2:
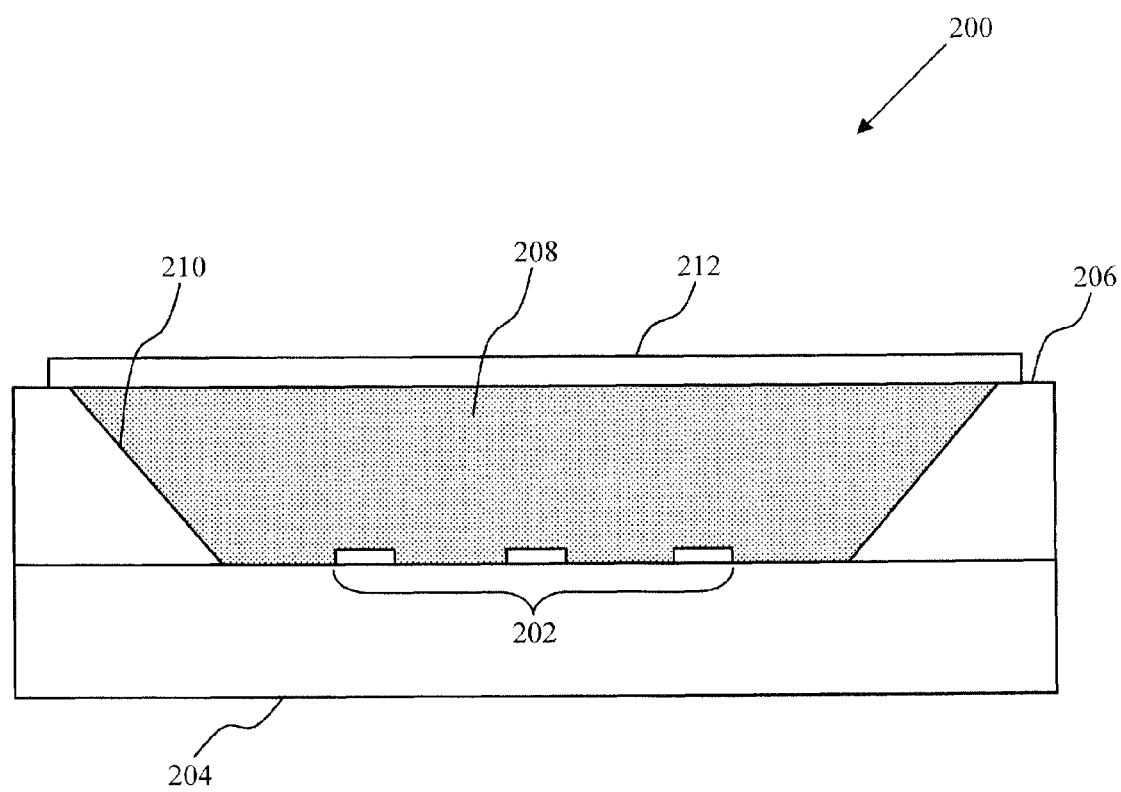
FIG. 2 is a cross-section view illustrating an example of a light emitting device having a plurality of light emitting semiconductors and a phosphor layer.

FIG. 2 is a cross-section view illustrating an example of a light emitting device 200 having a plurality of light emitting semiconductors 202 and a phosphor layer 212. Each of the plurality of light emitting semiconductors 202, substrate 204, recessed housing 206, cavity 208, reflective inner wall 210, and the phosphor layer 212 of FIG. 2 correspond to the light emitting semiconductor 102, substrate 104, recessed housing 106, cavity 108, reflective inner wall 110, and phosphor layer 112 of FIG. 1, respectively, and as such, their respective descriptions are omitted.

The device 200 differs from the device 100 of FIG. 1 in the number of the light emitting semiconductors 202. The device 200 may include any number of the light emitting semiconductors 202 (e.g., nine light emitting semiconductors 202) that may be arranged in an array of any size (e.g., nine of the light emitting semiconductors 202 arranged in a 3×3 array).

During the construction of the device 200, the phosphor layer 212 may be separately manufactured and tested, as previously described with reference to FIG. 1. Also, as described with reference to FIG. 1, light emitting semiconductors 202 and phosphor layer 212 may be selected based on their respective optical characteristics prior to their incorporation into the device 200. This ensures that the device 200, having the selected phosphor layer 212 and the light emitting semiconductors 212, will have the desired optical characteristics. For example, nine light emitting semiconductors 202 having similar average wavelengths and the phosphor layer 212 having a uniform thickness and phosphor particle dispersion may be used to construct the device 200, which, as a result of the specific optical characteristics of the phosphor layer 212 and the light emitting semiconductors 220, may have a uniform color temperature.

Figure 3:
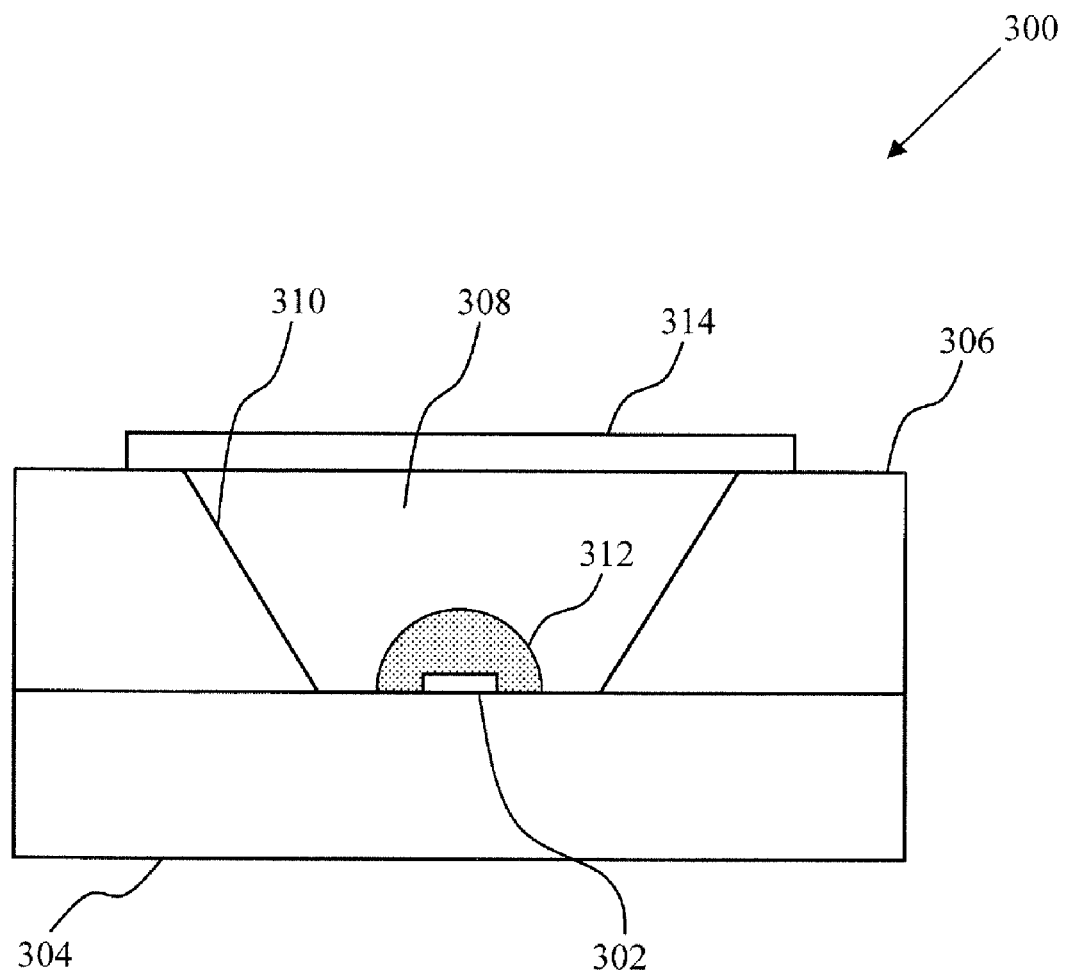
FIG. 3 is a cross-section view illustrating an example of a light emitting device having a phosphor layer and an air gap.

FIG. 3 is a cross-section view illustrating an example of a light emitting device 300 having a phosphor layer 314 and an air gap. Light emitting semiconductor 302, substrate 304, recessed housing 306, cavity 308, reflective inner wall 310, and the phosphor layer 314 of FIG. 3 correspond to the light emitting semiconductor 102, substrate 104, recessed housing 106, cavity 108, reflective inner wall 110, and phosphor layer 112 of FIG. 1, respectively, and as such, their respective descriptions are omitted.

The device 300 differs from the device 100 of FIG. 1 in that it includes an encapsulation layer 312 that may be deposited so as to encapsulate the light emitting semiconductor 302. The encapsulation layer 312 may be composed of silicone, for example, or a similar material. The encapsulation layer 312 may be of any suitable shape, such as a semi-spherical dome, for example. The phosphor layer 314 may be supported by the recessed housing 306 in such a way as to create an air gap between the encapsulation layer 312 and the phosphor layer 314.

The construction of the device 300 is similar to that of the device 100 of FIG. 1 in that the phosphor layer 314 and the light emitting semiconductor 302 are selected based on their characteristics and combined in the construction of the device 300 to ensure that the device 300 has the desired optical characteristics.

Figure 4:
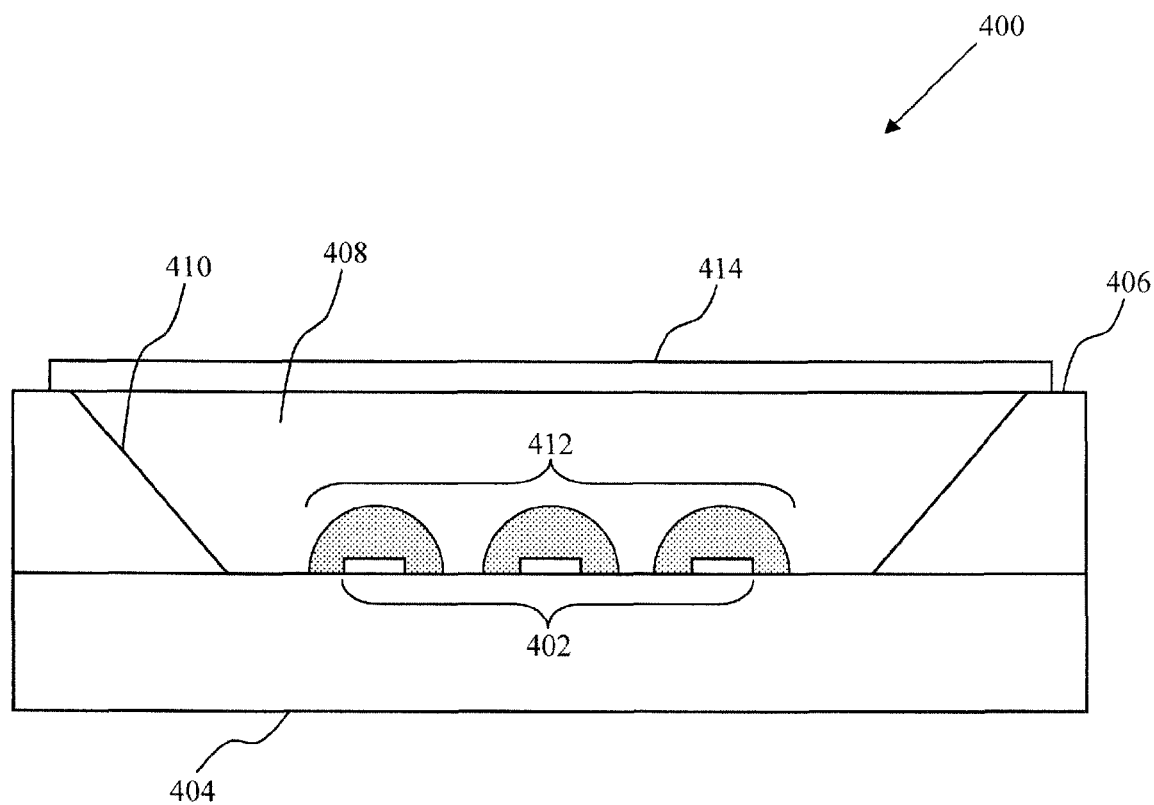
FIG. 4 is a cross-section view illustrating an example of a light emitting device having a plurality of light emitting semiconductors, a phosphor layer, and an air gap.

FIG. 4 is a cross-section view illustrating an example of a light emitting device 400 having a plurality of light emitting semiconductors 402 encapsulated in their respective encapsulation layers 412, a phosphor layer 414, and an air gap between the encapsulation layers 412 and the phosphor layer 414. Each of the plurality of light emitting semiconductors 402, substrate 404, recessed housing 406, cavity 408, reflective inner wall 410, the encapsulation layers 412, and the phosphor layer 412 of FIG. 4 correspond to the light emitting semiconductor 302, substrate 304, recessed housing 306, cavity 308, reflective inner wall 310, encapsulation layer 312, and the phosphor layer 314 of FIG. 3, respectively, and as such, their respective descriptions are omitted.

The device 400 differs from the device 300 of FIG. 3 in the number of the encapsulated light emitting semiconductors 402. The device 400 may include any number of the light emitting semiconductors 402 that may be arranged in an array of any size, similar to the device 200 shown in FIG. 2.

The construction of the device 300 is similar to that of the device 200 of FIG. 2 in that the phosphor layer 414 and the light emitting semiconductors 402 are selected based on their characteristics and combined in the construction of the device 400 to ensure that the device 400 has the desired optical characteristics.

Figure 5:
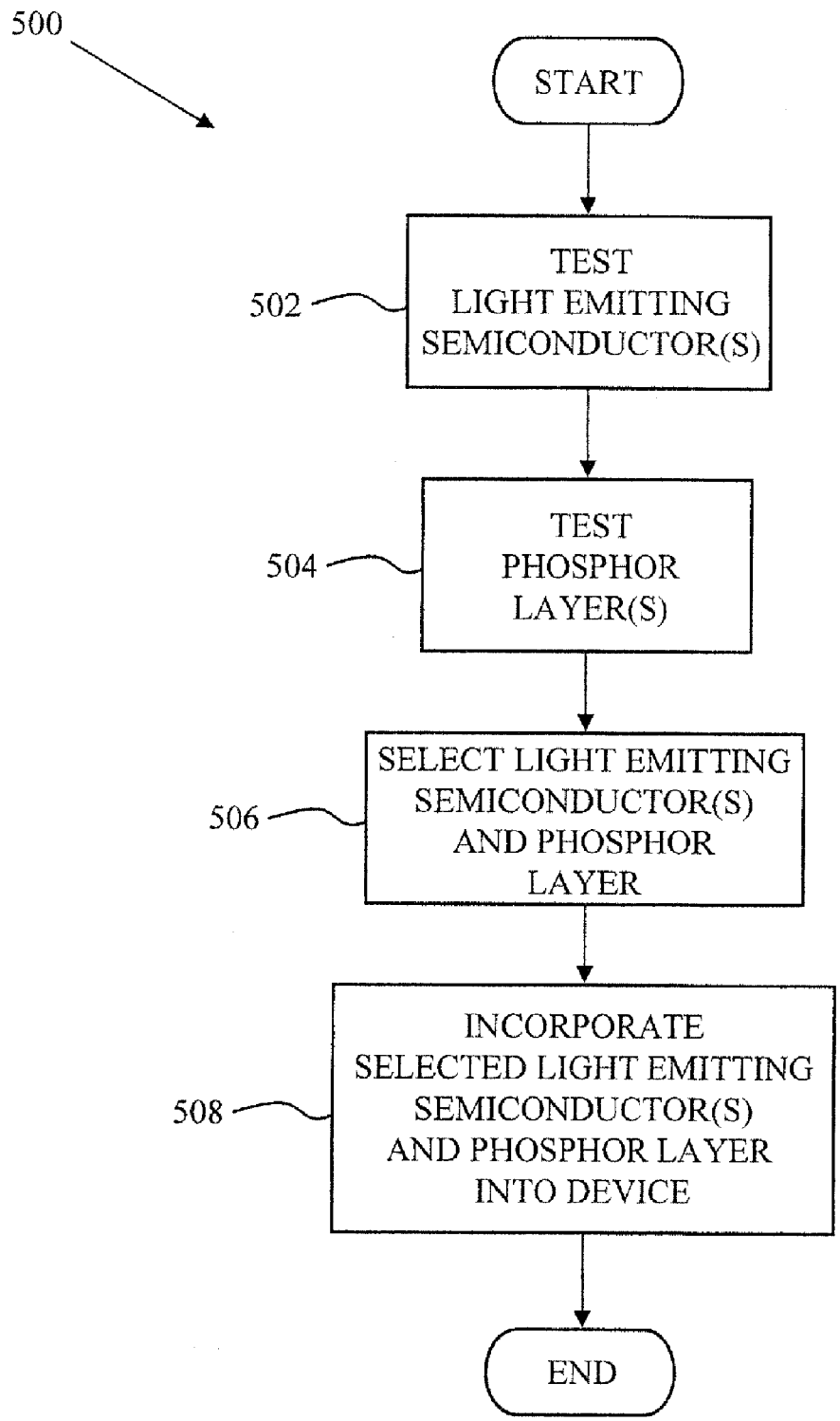
FIG. 5 is a flow-chart diagram illustrating an example of manufacturing a light emitting device.

FIG. 5 is a flow-chart diagram illustrating an example of a process for manufacturing a light emitting device, such as one of the devices 100, 200, 300, and 400. The process begins and proceeds to block 502, where at least one light emitting semiconductor is tested and its optical characteristics are determined. After block 502, the process proceeds to block 504 where at least one phosphor layer is tested and its optical characteristics are determined.

Once the optical characteristics of the light emitting semiconductors and the phosphor layers are determined, the process proceeds to block 506, where a phosphor layer and at least one light emitting semiconductor are selected based on their determined optical characteristics to be used in the construction of a light emitting device. The process then proceeds to block 508, where the selected phosphor layer and the at lest one light emitting semiconductor are incorporated into the light emitting device.

LEDs with preselected light emitting semiconductors and phosphor layers, as described above, may be used in numerous applications. By way of example, these LEDs may be well suited for liquid crystal display (LCD) backlighting applications. Other applications may include, but are not limited to, automobile interior lighting, light bulbs, lanterns, streetlights, flashlights, or any other application where LEDs are used.

The above description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method for manufacturing a light emitting device, the method comprising:
    forming a plurality of light emitting semiconductors;
    forming a plurality of phosphor layers independently of the light emitting semiconductors;
    testing the plurality of light emitting semiconductors independently from the phosphor layers to determine optical characteristics of the plurality of light emitting semiconductors;
    testing the phosphor layers independently from the light emitting semiconductors to determine optical characteristics of the phosphor layers prior to incorporating a phosphor layer of the phosphor layers into the light emitting device; and
    incorporating one of the phosphor layers and said plurality of light emitting semiconductors into the light emitting device based on the optical characteristics of said one of the phosphor layers and said plurality of light emitting semiconductors determined through testing the plurality of light emitting semiconductors while avoiding binning of the individual light emitting conductors.

2. The method of claim 1, further comprising selecting one of the phosphor layers from the plurality of phosphor layers based on the respective determined optical characteristics of the phosphor layers and said plurality of light emitting semiconductors.

3. The method of claim 2, further comprising determining the optical characteristics of the light emitting device based on the selected said one of the phosphor layers and the plurality of light emitting semiconductors.

4. A method for manufacturing a light emitting device, the method comprising:
    forming a plurality light emitting semiconductors;
    forming a plurality of phosphor layers independently of the light emitting semiconductors;
    testing the phosphor layers independently of the light emitting semiconductors to determine optical characteristics of the phosphor layers; and
    incorporating one of the phosphor layers with the plurality of light emitting semiconductors into the light emitting device based on the optical characteristics of said one of the phosphor layers determined through testing while avoiding testing of the optical characteristics of the individual light emitting semiconductors.

5. The method of claim 4, further comprising selecting said one of the phosphor layers for incorporation with said plurality of light emitting semiconductors based on the determined optical characteristics of said one of the phosphor layers.

6. The method of claim 5, wherein said one of the phosphor layers is selected based on a uniformity of a thickness and a uniformity of a phosphor particle distribution of said one of the phosphor layers.

7. The method of claim 4, further comprising testing the plurality of light emitting semiconductors independently of the phosphor layers to determine optical characteristics of said plurality of light emitting semiconductors.

8. The method of claim 7, further comprising selecting said plurality of light emitting semiconductors for incorporation with said one of the phosphor layers based on the determined optical characteristics of plurality of light emitting semiconductors.

9. The method of claim 8, wherein the plurality of light emitting semiconductors is selected based on an average wavelength of emitted light.

10. The method of claim 4, wherein the phosphor layers are formed through doctor blading.

11. The method of claim 4, wherein the phosphor layers are formed through screen printing.

\* \* \* \* \*